(12) United States Patent
Wang et al.

(10) Patent No.: US 10,819,891 B2
(45) Date of Patent: Oct. 27, 2020

(54) CAMERA MODULE HAVING TRANSPARENT COVER PLATE CONFIGURED TO BE TARGET OPTICAL LENS AND TARGET OPTICAL LENS USED AS EXTERNAL OPTICAL LENS AND METHOD FOR MANUFACTURING CAMERA MODULE, AND DISPLAY DEVICE HAVING CAMERA MODULE AND METHOD FOR MANUFACTURING DISPLAY DEVICE

(71) Applicants: Chengdu BOE Optoelectronics Technology Co., Ltd., Chengdu, Sichuan (CN); BOE Technology Group Co., Ltd., Beijing (CN)

(72) Inventors: Yang Wang, Beijing (CN); Fei Liu, Beijing (CN); Jianqiang Liu, Beijing (CN); Kuo Sun, Beijing (CN); Haihong Zheng, Beijing (CN); Yuanyuan Chai, Beijing (CN)

(73) Assignees: CHENGDU BOE OPTOELECTRONICS TECHNOLOGY CO., LTD, Sichuan Province (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/337,485

(22) PCT Filed: May 15, 2018

(86) PCT No.: PCT/CN2018/086909
§ 371 (c)(1),
(2) Date: Mar. 28, 2019

(87) PCT Pub. No.: WO2018/228117
PCT Pub. Date: Dec. 20, 2018

(65) Prior Publication Data
US 2019/0349503 A1 Nov. 14, 2019

(30) Foreign Application Priority Data
Jun. 12, 2017 (CN) .......................... 2017 1 0438562

(51) Int. Cl.
*H04N 5/225* (2006.01)
*G03B 17/12* (2006.01)
*H05K 1/18* (2006.01)

(52) U.S. Cl.
CPC .......... *H04N 5/2254* (2013.01); *G03B 17/12* (2013.01); *H05K 1/189* (2013.01); *H04N 5/2257* (2013.01)

(58) Field of Classification Search
CPC .... H04N 5/2254; H04N 5/2257; G03B 17/12; H05K 1/189; G09F 9/00
See application file for complete search history.

(56) References Cited

U.S. PATENT DOCUMENTS 9,154,678 B2 * 10/2015 Kwong ................. G06F 1/1637
2017/0285686 A1   10/2017 Kwong et al.
2019/0369355 A1 * 12/2019 Fukuyama ............... G02B 7/04

FOREIGN PATENT DOCUMENTS

CN   103685885 A   3/2014
CN   104717409 A   6/2015
(Continued)

OTHER PUBLICATIONS

International Search Report and Written Opinion of PCT/CN2018/086909, dated Aug. 13, 2018.
(Continued)

*Primary Examiner* — Padma Haliyur
(74) *Attorney, Agent, or Firm* — Fay Sharpe LLP (57) ABSTRACT

The present disclosure discloses a camera module and a manufacturing method thereof, a display device and a manufacturing method thereof, in the field of display technology. The display panel includes a display substrate and a trans-
(Continued)

parent cover plate on the display substrate. The camera module includes a camera and a transparent cover plate attached to the camera, wherein a part of the transparent cover plate is configured as a target optical lens which is used as an external optical lens of the camera, and the transparent cover plate is configured to protect a display device. With the present disclosure, the thickness of the camera module is reduced. The present disclosure is used for capturing an image.

18 Claims, 7 Drawing Sheets

(56) References Cited

FOREIGN PATENT DOCUMENTS

| | | |
|---|---|---|
| CN | 107277316 A | 10/2017 |
| CN | 102902039 A | 1/2019 |

OTHER PUBLICATIONS

The first office action of the priority application No. 201710438562.8 dated Mar. 5, 2019.

\* cited by examiner

CAMERA MODULE HAVING TRANSPARENT COVER PLATE CONFIGURED TO BE TARGET OPTICAL LENS AND TARGET OPTICAL LENS USED AS EXTERNAL OPTICAL LENS AND METHOD FOR MANUFACTURING CAMERA MODULE, AND DISPLAY DEVICE HAVING CAMERA MODULE AND METHOD FOR MANUFACTURING DISPLAY DEVICE

CROSS-REFERENCE TO RELATED APPLICATION

The present application is a 371 of PCT/CN2018/086909 filed on May 15, 2018, which claims priority to Chinese Patent Application No. 201710438562.8, filed with the National Intellectual Property Administration, PRC on Jun. 12, 2017 and titled "Display Panel and Manufacturing thereof. Display Device and Manufacturing Method thereof", which is incorporated herein by reference in its entirety.

TECHNICAL FIELD

The present disclosure relates to the field of display technology and in particular to a camera module and a manufacturing method thereof, a display device and a manufacturing method thereof.

BACKGROUND

A display device with a camera function includes a glass cover plate, a display panel and a camera module. The glass cover plate is configured to protect the display panel and camera module in the display device. The camera module includes a lens set consisting of a plurality of optical lenses, a voice coil motor, an image sensor, and a wire connection substrate.

SUMMARY

The embodiments of the present disclosure provide a camera module and a manufacturing method thereof, a display device and a manufacturing method thereof. The technical solutions are as follows.

In a first aspect, there is provided camera module, comprising: a camera and a transparent cover plate attached onto the camera, wherein a part of the transparent cover plate is configured as a target optical lens which is used as an external optical lens of the camera, and the transparent cover plate is configured to protect a display device.

Optionally, for the transparent cover plate, a total number of the target optical lens configured by the transparent cover plate is 1.

Optionally, the camera module comprises an optical lens set, which comprises an external optical lens and an internal optical lens, wherein an optical axis of the external optical lens coincides with an optical axis of the internal optical lens.

Optionally, the external optical lens is used as at least one layer of external optical lens in the optical lens set.

Optionally, a total layer number of the optical lenses in the optical lens set is at least 3.

Optionally, the external optical lens is used as an outermost layer of external optical lens in the optical lens set, and a distance between a central point of the external optical lens and any edge of the transparent cover plate is greater than or equal to a distance threshold whose range is from 5 mm to 10 mm.

Optionally, the external optical lens is a concave lens.

Optionally, the camera module further comprises: a mounting framework and an image sensor that are both fixedly connected to the optical lens set; wherein a geometric center of an orthographic projection of the mounting framework on the transparent cover plate, a geometric center of an orthographic projection of the image sensor on the transparent cover plate, and a geometric center of an orthographic projection of the internal optical lens on the transparent cover plate coincide with a geometric center of the external optical lens.

Optionally, the mounting framework is a driving motor that drives the optical lens set to move or a holder for securing the optical lens set.

Optionally, the driving motor consists of a MEMS (Micro-Electro-Mechanical System).

Optionally, the driving motor is a voice coil motor.

Optionally, the camera module comprises: a front camera module.

Optionally, the transparent cover plate is made of one of glass, quartz and resin.

Optionally, the transparent cover plate is a glass cover plate, a part of the glass cover plate is configured as a target optical lens which is used as an outermost layer of external optical lens of the camera, an optical lens set in the module comprises: the outermost layer of external optical lens and at least two layers of internal optical lenses, wherein an optical axis of the outermost layer of external optical lens coincides with an optical axis of the at least two layers of internal optical lenses; the external optical lens is a concave lens, and a distance between a central point of the external optical lens and any edge of the glass cover plate is greater than or equal to a distance threshold whose range is from 5 mm to 10 mm; the module further comprises: a mounting framework and an image sensor that are both fixedly connected to the optical lens set; wherein a geometric center of an orthographic projection of the mounting framework on the glass cover plate, a geometric center of an orthographic projection of the image sensor on the glass cover plate, and a geometric center of an orthographic projection of each of the internal optical lenses on the glass cover plate coincide with a geometric center of the outermost layer of external optical lens.

In another aspect, there is provided a display device, comprising a display panel and at least one camera module at a side of the display panel; wherein the at least one camera module comprises: a camera and a transparent cover plate at a side, away from the display panel, of the camera, the at least one camera module comprises the same transparent cover plate, the transparent cover plate is configured to protect the display panel, at least one target optical lens is disposed in the transparent cover plate, the at least one target optical lens corresponds to the at least one camera module, and the target optical lens is used as an external optical lens of a corresponding camera.

Optionally, the display device comprises: a camera module, wherein a part of the transparent cover plate is configured as the target optical lens, and the target optical lens is used as an external optical lens of the camera in the at least one camera module.

Optionally, the display panel is one of an organic light-emitting diode display panel and a liquid crystal display panel.

In a yet another aspect, there is provided a manufacturing method of a camera module, comprising: providing a transparent cover plate configured to protect a display panel in a display device; processing a part of the transparent cover plate, to enable the processed part of transparent cover plate to be configured as a target optical lens; providing a camera; and attaching the transparent cover plate onto the camera, to enable the target optical lens to be used as an external optical lens of the camera.

Optionally, processing a part of the transparent cover plate, to enable the processed part of transparent cover plate to be configured as a target optical lens comprises: optically processing the transparent cover plate by any one of ELID (Electrolytic In-process Dressing) processing, laser processing, ultrasonic grinding and precision ultrasonic milling, to enable the processed part of transparent cover plate to be configured as the target optical lens.

In still yet another aspect, there is provided a manufacturing method of a display device, comprising: manufacturing a camera module with the manufacturing method of the camera module in the present disclosure; providing a display panel; and encapsulating the camera module on the display panel.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

To make objectives, technical solutions, and advantages of the present disclosure clearer, the embodiments of the present disclosure will be further described below in detail with reference to the accompanying drawings.

As the demand for higher screen-to-body ratio for a display module of consumer electronics products becomes stronger and stronger, a product with an ultra-high screen-to-body ratio or even a bezel-less full-screen product will be the trend of future development. However, during research on these products, integration between a camera module and a display panel is an extremely challenging problem. In the related art, the camera module and the display panel are usually integrated in two ways. One is that the camera module and the display panel are simply integrated physically by directly attaching the camera module onto the display panel. The other is that the camera module and the display panel are highly integrated by integrating the camera module onto the display panel and then encapsulating the glass cover plate on a display panel onto which the camera module is integrated during the manufacturing process of the display panel. The second integration method can reduce the camera parts assembly process, material supervision of a camera, the integration cost of a display device, and the difficulty in managing and controlling a client supply chain of the display device, contributes to cost reduction, improves competitiveness of the display device, therefore, it is extensively applied.

However, since the camera module is relatively thick, the display device is also relatively thick, and the integration between the camera module and the display panel is relatively difficult. For example, since the physical volume of the camera module of a mobile phone is relatively big, it is relatively hard to integrate the module with the display panel and particularly hard to integrate the module with an OLED display panel.

Figure 1:
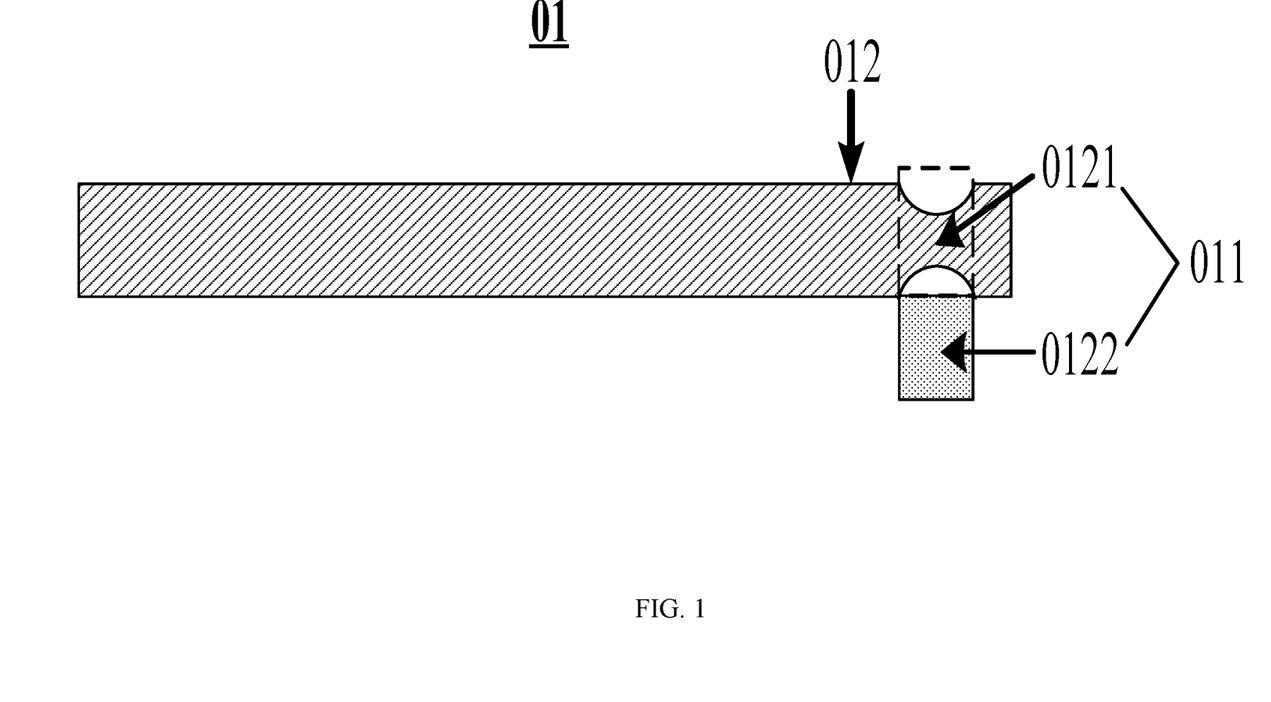
FIG. 1 is a structural schematic diagram of a camera module provided in accordance with an embodiment of the present disclosure.

An embodiment of the present disclosure provides a camera module. FIG. 1 is a structural schematic diagram of the camera module provided by the embodiment of the present disclosure. As shown in FIG. 1, the camera module 01 may include: a camera 011 and a transparent cover plate 012 attached to the camera 011. The transparent cover plate 012 is configured to protect the display device. The transparent cover plate 012 may be a cover plate made of a light-transmitting non-metallic material with certain hardness, such as glass or plastic. For example, the transparent cover plate is made of one of glass, quartz and resin. Optionally, the camera module 01 may be a front camera module.

In addition, a part of the transparent cover plate 012 is configured as a target optical lens which is used an external optical lens 0121 of the camera 011.

FIG. 1 is merely a merely illustrative and is not intended to limit such parameters as geometrical shape and thickness of the external optical lens. Those skilled in the art may design and process relevant areas on the transparent cover plate 012 according to design requirements of a lens module in a display device with a camera function such as mobile phone.

In summary, according to the camera module provided by the embodiment of the present disclosure, by configuring the transparent cover plate to be the target optical lens and reusing the target optical lens as the external optical lens of the camera, in comparison with the related art, the thickness of the external optical lens is subtracted from that of the camera module. Thus, the difficulty in integrating the camera module with the display panel is reduced.

Optionally, in the transparent cover plate, there may be at least one target optical lens configured by the transparent cover plate. The at least one target optical lens may be used as the external optical lens of the at least one camera, respectively. In addition, the at least one external optical lens and the at least one camera module 01 in the display device may be in one-to-one correspondence. At this time, each target optical lens area may be used as the external optical lens 0121 of the corresponding camera module 01. For example, as shown in FIG. 1, when the number of camera module 01 integrated with the display panel in the display device is one, in the transparent cover plate, the total number of target optical lens configured by the transparent cover plate may be one (as shown in dotted line in FIG. 1). The target optical lens may be used as the external optical lens 0121 of the camera module 01.

Figure 2:
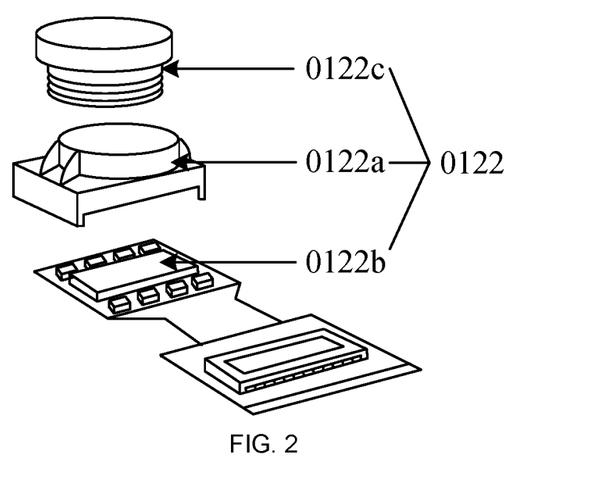
FIG. 2 is a structural schematic diagram of other components in a camera module in accordance with an embodiment of the present disclosure.

In an implementation, the camera module 01 may include an external optical lens 0121 and other components 0122 except the external optical lens 0121. Referring to FIG. 2, the other components 0122 in the camera module may include a mounting framework 0122a, an image sensor 0122b, and an internal optical lens 0122c.

The internal optical lens 0122c and the external optical lens 0121 constitute the optical lens set of the camera module 01. That is, the camera module 01 may include the optical lens set, which may include the external optical lens 0121 and the internal optical lens 0122c. The external optical lens 0121 covers the side, away from the display panel 1, of the internal optical lens 0122c. To ensure that the external optical lens 0121 and the internal optical lens 0122c may achieve the function of the optical lens set after being combined, an optical axis of the external optical lens 0121 coincides with that of the internal optical lens 0122c.

Optionally, the target optical lens may be reused as at least one layer of external optical lens 0121 in the corresponding optical lens set. The total number of the optical lenses in the optical lens set may be at least 3. For example, the optical lens set may include 3, 5, or 6 optical lenses, etc., which will not be limited by the embodiment of the present disclosure.

Further, to guarantee that the camera module has a better imaging photosensitivity, the geometric center of an orthographic projection of the mounting framework 0122a on the transparent cover plate 012, the geometric center of an orthographic projection of the image sensor 0122b on the transparent cover plate 012, and the geometric center of an orthographic projection of each layer of internal optical lens 0122c on the transparent cover plate 012 may coincide with the geometric center of the external optical lens 0121.

Optionally, each target optical lens area may be reused as of the outermost layer of external optical lens in the corresponding optical lens set. At this time, the outermost layer of optical lens is the outermost optical lens among the plurality of layers of optical lenses in the camera module.

Figure 3:
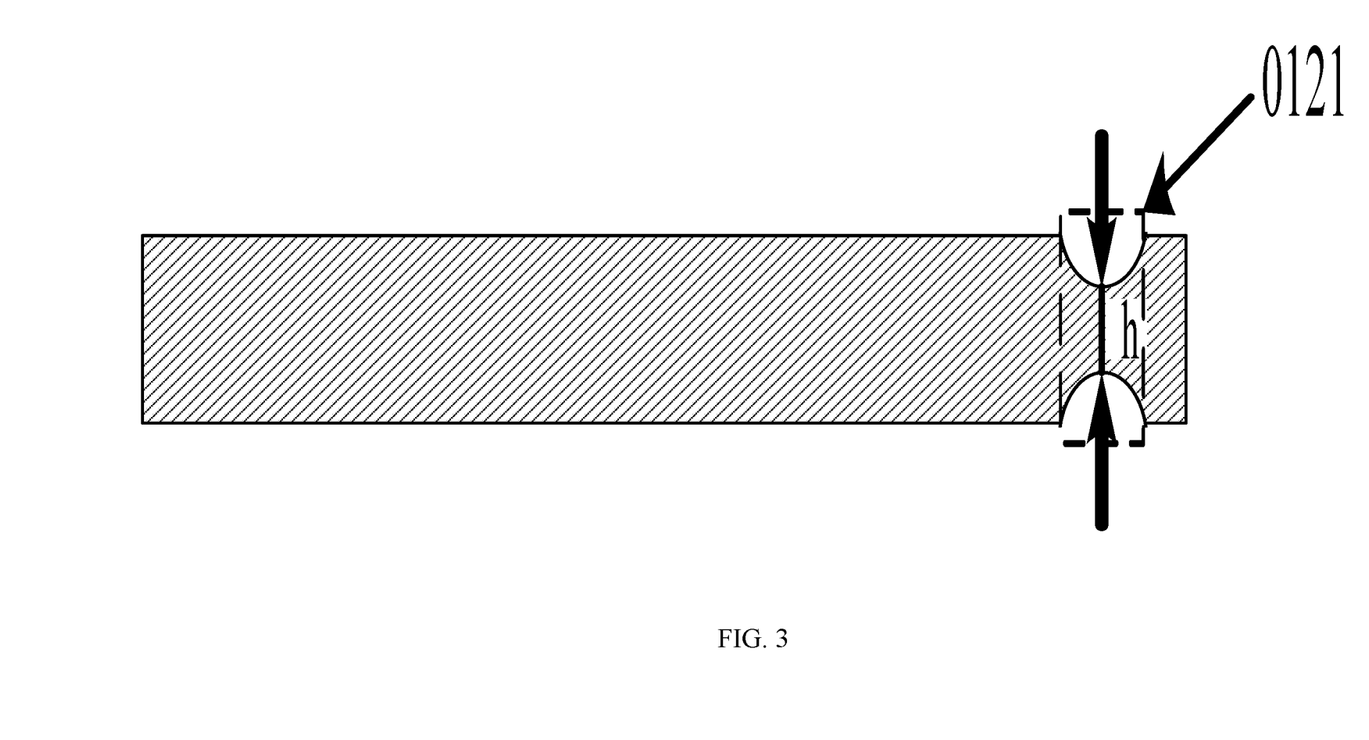
FIG. 3 is a schematic sectional diagram of an outermost layer of external optical lens at its normal in accordance with an embodiment of the present disclosure.

In addition, the external optical lens may be a concave lens. Exemplarily, FIG. 3 is a schematic sectional view of the outermost layer of external optical lens 0121 at its normal. As shown in FIG. 3, the outermost layer of external optical lens 0121 may be a concave lens, which may constitute the optical lens set with the effect of a convex lens together with the at least one layer of internal optical lens 0122c. When the optical lens is the concave lens, a production process of the concave lens may be simplified.

At this time, the thickness h at the center of the outermost layer of external optical lens 0121 may be determined according to actual needs. For example, the thickness h may be 1.5 mm.

It should be noted that the outermost layer of external optical lens 0121 may also be a convex lens, which may constitute the optical lens set with the effect of a convex lens together with the at least one internal optical lens 0122c. Alternatively, the outermost layer of external optical lens 0121 may also be a plane mirror, which may constitute the optical lens set with the effect of a convex lens together with the at least one internal optical lens 0122c. Whether the outermost layer of external optical lens 0121 is the concave lens, the convex lens, the plane mirror, or the like may be determined according to actual needs and will not be specifically limited in the embodiment of the present disclosure.

Figure 4:
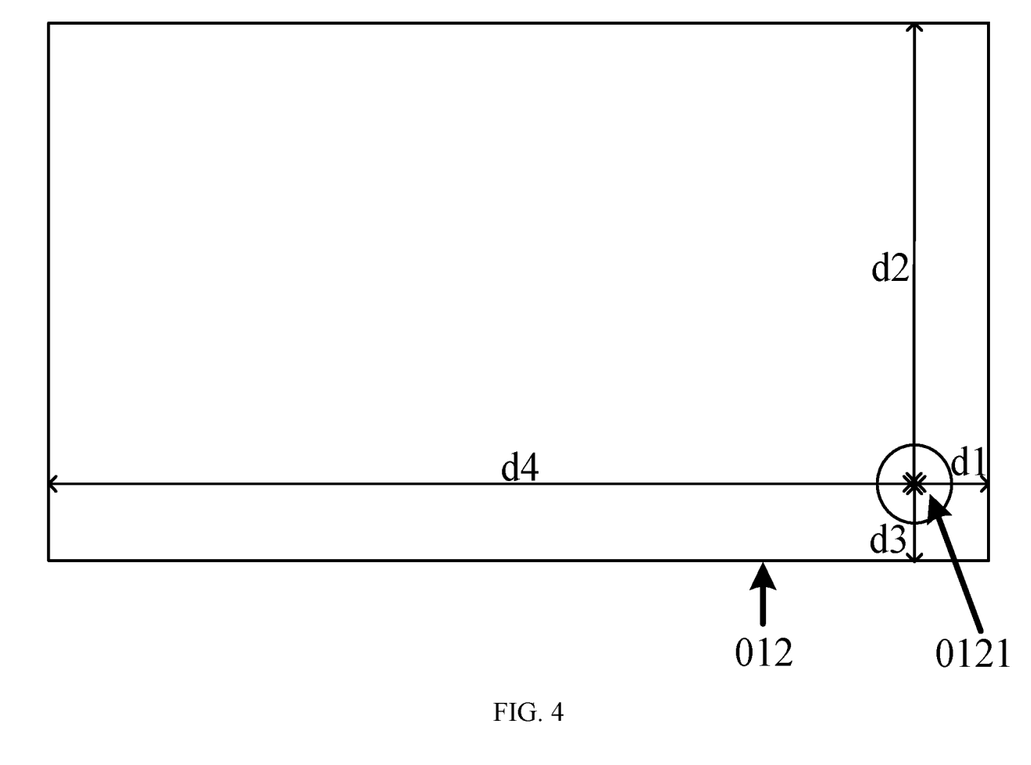
FIG. 4 is a schematic top view of an outermost layer of optical lens in accordance with an embodiment of the present disclosure.

FIG. 4 is a schematic top view of the outermost layer of external optical lens 0121. As shown in FIG. 4, distances d1, d2, d3, and d4 between the center of the outermost layer of optical lens 011 and 4 edges of the transparent cover plate 012 may be greater than or equal to a distance threshold, which is set before manufacture of the optical lens and may be determined according to actual needs. For example, the distance threshold may be 5-10 mm. Exemplarily, when the display device is a mobile phone, the distance between the center of the external optical lens and each edge of the transparent cover plate may be is a distance between the center of a front camera and a corresponding edge of a glass cover plate of the mobile phone.

Optionally, in the camera module, the mounting framework 0122a may be a driving motor that drives the optical lens set to move or a holder for securing the optical lens set. The orthographic projection of the mounting framework 0122a on the transparent cover plate 012 may be a regular figure such as a circle, a square, an equilateral triangle, or other regular shapes.

Further, the driving motor may be a multi-module-layered structure consisting of a MEMS (Micro-Electro-Mechanical System). When the driving motor consisting of the MEMS replaces a driving motor in the related art, the thickness of the camera module may further be reduced, thereby reducing the thickness of the display device further and improving the integration level of the display device and the mechanical reliability of the camera module.

Alternatively, the driving motor may also be a Voice Coil Motor (VCM). When the driving motor is the VCM, the camera module may be endowed with an automatic focusing function by virtue of the characteristics of high frequency response and high precision of the VCM. The location of the optical lens set may be adjusted by the VCM, such that the camera module may present clearer images.

Optionally, the camera module may further include a passive element, a Flexible Printed Circuit Board (FPCB)/Flexible Printed Circuit (FPC), a connector, and the like. A signal in the camera module may be transmitted to a corresponding device through these components. For example, a signal of a camera module in a mobile phone may be transmitted to a circuit board of the mobile phone. Alternatively, a signal of a camera module in a tablet PC may be transmitted to a circuit board of the tablet PC. Alternatively, a signal of a camera module in a laptop may be transmitted to a circuit board of the laptop. Alternatively, a signal of a camera module in a display may be transmitted to a circuit board of the display.

Although the example that the transparent cover plate constitutes one layer of external optical lens is described by the applicant in the attached drawings, based on technological progress of the art, it can be understood by those skilled in the art that it is also feasible to constitute other components in the display device to a plurality of layers of external optical lenses. For example, the transparent cover plate and outer device protection glass may be respectively constituted to the external optical lenses, etc.

In summary, according to the camera module provided by the embodiment of the present disclosure, by configuring the transparent cover plate to be the target optical lens and reusing the target optical lens as the external optical lens of the camera, in comparison with the prior art, the thickness of the external optical lens is subtracted from that of the camera module. Thus, the difficulty in integrating the camera module with the display panel is reduced.

An embodiment of the present disclosure further provides a display device. Please continue referring to FIG. 5, the display device includes a display panel 02 and at least one camera module 01 at a side of the display panel. The camera module herein is the camera module provided in the foregoing embodiment. For example, the at least one camera module may include: a camera and a transparent cover plate at a side, away from the display panel, of the camera. The at least one camera module includes the same transparent cover plate, which is configured to protect the display panel. At least one target optical lens is disposed in the transparent cover plate, and the at least one target optical lens corresponds to the at least one camera module. The target optical lens is used as an external optical lens of a corresponding camera.

Figure 5:
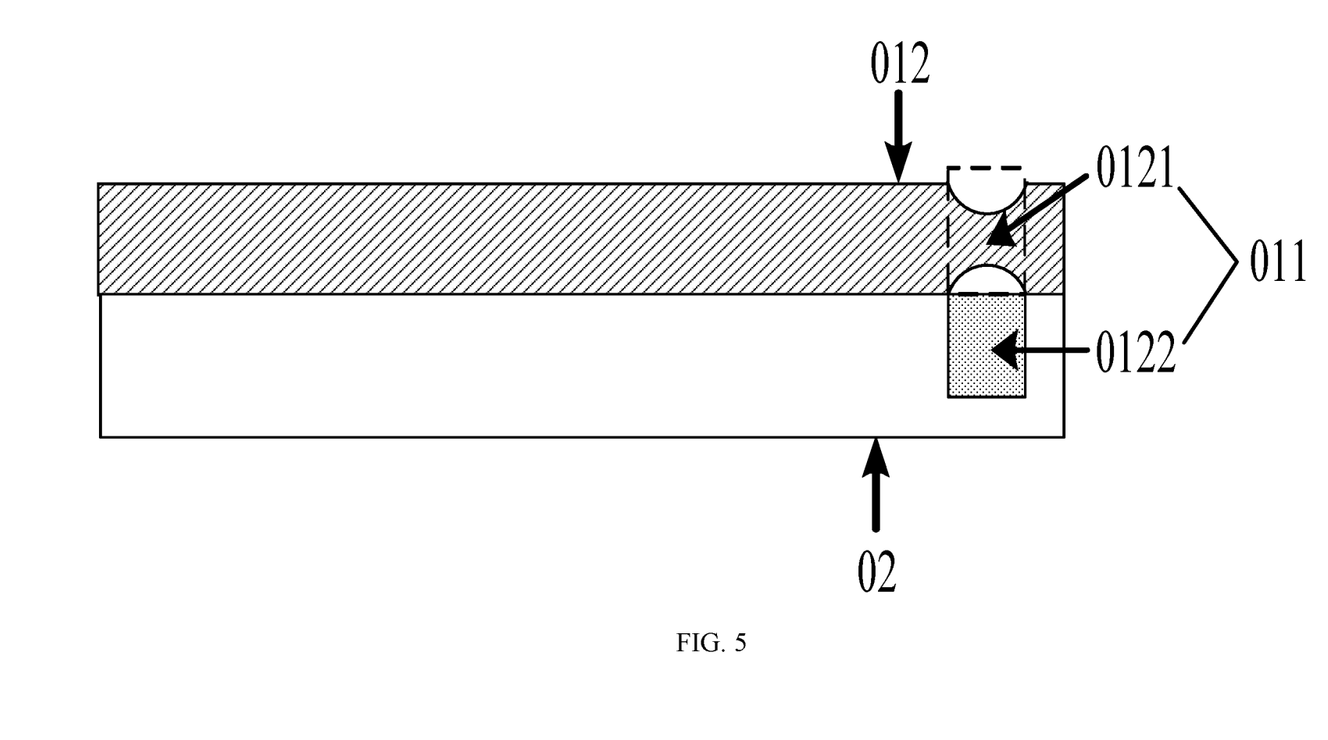
FIG. 5 is a structural schematic diagram of a display device in accordance with an embodiment of the present disclosure.

Here, FIG. 5 is an example illustrating the relationship between the position of the display panel and the position of the camera module, which is not intended to limit the present disclosure. The position of the display panel and the position of the camera module may be adjusted according to the integrating ways of the two.

In a possible implementation, the display device may include: a camera module. In this case, a part of the transparent cover plate is configured as a target optical lens, which is used as the external optical lens in the camera of a camera module.

The display panel provided in the embodiments of the present disclosure may be any products or parts with display and camera function, such as a mobile phone, a tablet PC, a television, a display, a laptop, a digital photo frame, and a navigator. Exemplarily, the display panel may be an organic light-emitting diode display panel or a liquid crystal display panel, and the display device may be a mobile phone. Correspondingly, the camera module may be a front camera module of the mobile phone.

In summary, according to the display device provided in the embodiments of the present disclosure, by configuring the transparent cover plate as the target optical lens, and reusing the target optical lens as the external optical lens of the camera module and integrating the camera module and the display panel into the display device, in comparison with the prior art, at least the thickness of the external optical lens is subtracted from that of the camera module. That is, the thickness of the display device is reduced. Thus, the difficulty in integrating the camera module with the display panel is reduced.

Figure 6:
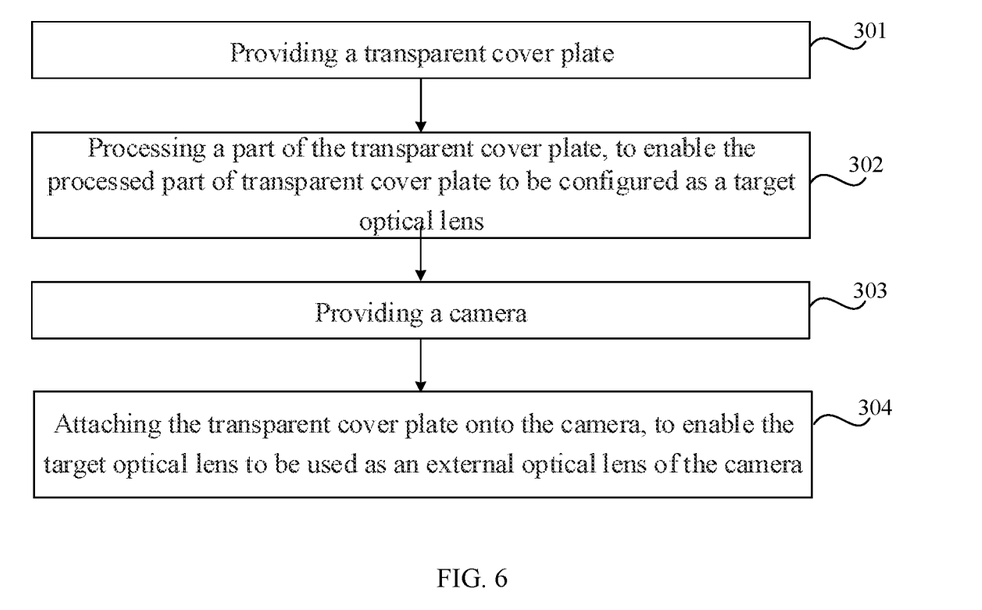
FIG. 6 is a flow chart of a manufacturing method of a camera module in accordance with an embodiment of the present disclosure.

An embodiment of the present disclosure further provides a manufacturing method of a camera module. As shown in FIG. 6, the manufacturing method may include the following steps.

In step 301, a transparent cover plate is provided.

Optionally, the transparent cover plate may be a cover plate made of a nonmetallic light-guiding material with certain hardness, such as glass, quartz, or resin. For example, the transparent cover plate may be a glass cover plate, quartz cover plate, or a resin cover plate.

In step 302, a part of transparent cover plate is processed to enable the processed part of transparent cover plate to be configured as external target optical lens.

Optionally, in step 302, such optical processing as grinding and polishing are performed on the part of transparent cover plate by any of ELID (Electrolytic In-process Dressing) processing, laser processing, ultrasonic grinding, and precision ultrasonic milling to enable the processed part of transparent cover plate to be configured as a target optical lens. Alternatively, after the optical processing, glass is laminated on the processed target optical lens and some oil layers are added to enable the target optical lens to be reused as a plurality of optical lenses in the corresponding camera module.

In step 303, a camera is provided.

Optionally, the camera may be obtained by assembling the components constituting the camera. For example, the camera may include a mounting frame, an image sensor, and an internal optical lens, etc. Thus, the mounting frame, the image sensor, and the internal optical lens may be assembled in sequence to obtain the camera.

In step 304, the transparent cover plate is attached onto the camera, to enable the target optical lens to be used as an external optical lens of the camera.

Each target optical lens may be reused as one or a plurality of layers of external optical lens in the corresponding camera module. In addition, when the target optical lens is reused as the outermost layer of external optical lens, the outermost layer of external optical lens is the outermost optical lens among the plurality of optical lenses in the camera module. At this time, the optical lens may be a concave lens, which may constitute an optical lens set with the effect of a convex lens together with at least one internal optical lens. When the target optical lens is reused as a plurality of layers of optical lenses, the layer of optical lens, which is farthest from the other components in the camera module, among the plurality of optical lenses is the outermost optical lens.

Geometric parameters of the optical lens may be selected accordingly based on the parameters of a photosensitive element of the camera module. For example, the thickness of the center of the outermost optical lens may be 1.5 mm. A distance between the center of the outermost optical lens and any edge of the glass cover plate may be greater than or equal to a distance threshold whose range may be from 5 to 10 mm.

In summary, according to the manufacturing method of the camera module provided in the embodiment of the present disclosure, by processing the transparent cover plate to enable a part of the transparent cover plate to be configured as the target optical lens, and reusing the target optical lens area as the optical lens of the camera module, in comparison with the related art, the thickness of the external optical lens is subtracted from that of the camera module. Thus, the difficulty in integrating the camera module with the display panel is reduced.

Figure 7:
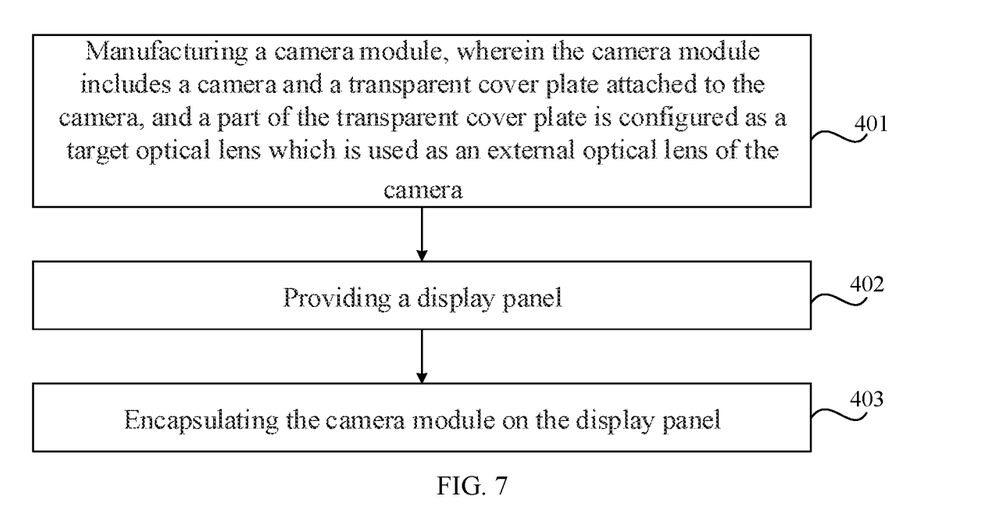
FIG. 7 is a flow chart of a manufacturing method of a display device in accordance with an embodiment of the present disclosure.

An embodiment of the present disclosure further provides a manufacturing method of a display device. As shown in FIG. 7, the method may include the following steps.

In step 401, a camera module is manufactured. The camera module includes a camera and a transparent cover plate attached onto the camera. A part of the transparent cover plate is configured as a target optical lens which is reused as an external optical lens of the camera.

For the implementing process of manufacturing the camera module, reference may be made to the manufacturing method for the camera module provided in the relevant embodiments of the present disclosure.

In step 402, a display panel is provided.

In step 304, the camera module is encapsulated on the display panel.

In summary, according to the manufacturing method of the display device provided in the embodiments of the present disclosure, by processing the transparent cover plate to enable a part of the transparent cover plate to be configured as the target optical lens, and reusing the target optical lens area as the optical lens of the camera module, in comparison with the related art, the thickness of the external optical lens is subtracted from that of the camera module, thereby reducing the thickness of the display device and reducing the difficulty in integrating the camera module with the display panel. High integration of the display device is facilitated.

Figure 8:
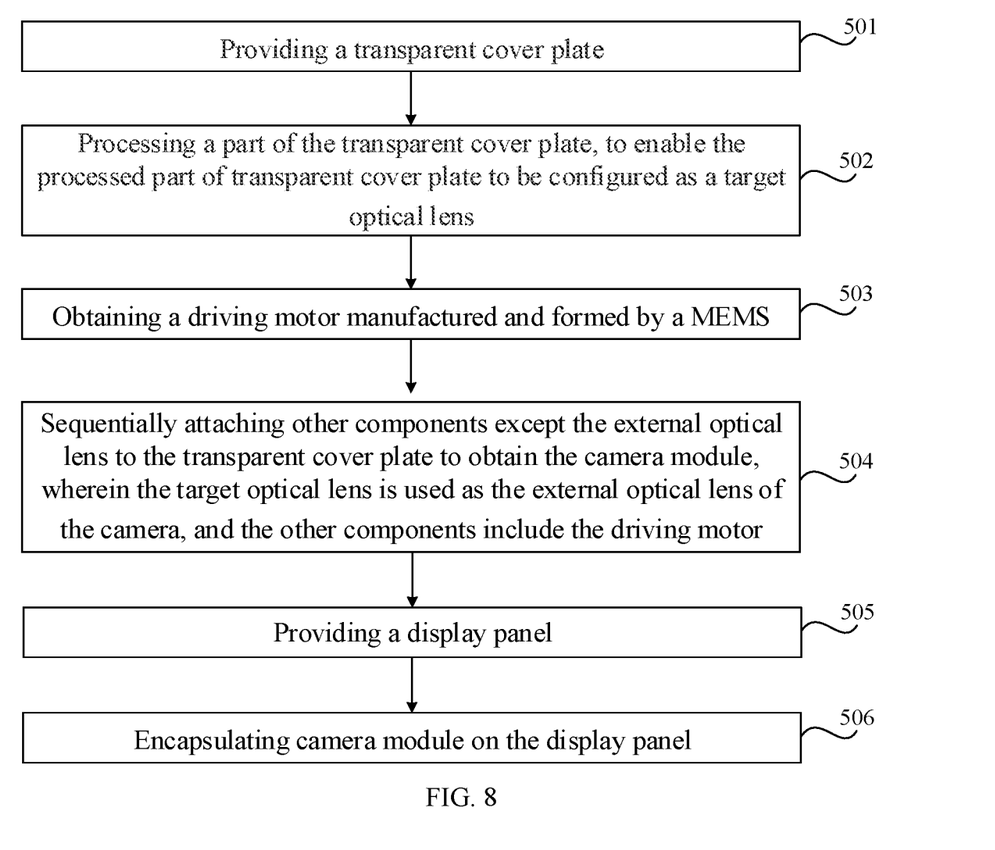
FIG. 8 is a flow chart of another manufacturing method of a display device in accordance with an embodiment of the present disclosure.

FIG. 8 illustrates another manufacturing method of a display device provided in an embodiment of the present disclosure. As shown in FIG. 8, the manufacturing method may include the following steps.

In step 501, a transparent cover plate is provided.

Please refer to the implementation of step 301 for that of step 501.

In step 502, a part of the transparent cover plate is processed to enable the processed part of the transparent cover plate to be configured as a target optical lens.

The target optical lens may be reused as at least one layer of external optical lens in the camera module. Referring to the implementation of step 302 for that of step 502.

In step 503, a driving motor manufactured and formed by a MEMS is obtained.

During the manufacturing process of the display device, the driving motor which is pre-manufactured may be obtained and assembled in the display device. For example, when the driving motor is the motor with a multi-module-layered structure manufactured and formed by the MEMS, the manufactured driving motor may be directly obtained. Alternatively, when the driving motor is a VCM, the manufactured VCM may be directly obtained. Besides, when the driving motor is the VCM, the camera module may be endowed with an automatic focusing function by virtue of the characteristics of high frequency response and high precision of the VCM. The location of the optical lens set may be adjusted by the VCM, such that the camera module may present clearer images.

Alternatively, the MEMS may be used for manufacturing the driving motor in real time during the manufacturing process of the display device. When the driving motor manufactured by the MEMS replaces a driving motor in the related art, the thickness of the camera module may be reduced. Further, the thickness of the display device is reduced. The integration level of the display device and the mechanical reliability of the camera module are improved.

In step 504, other components except the external optical lens are sequentially attached to the transparent cover plate to obtain the camera module. The target optical lens is used as the external optical lens of the camera and the other components include the driving motor.

Optionally, each camera module may include the external optical lens and the other components except the external optical lens. The other components may include a mounting framework fixedly connected to an optical lens set, an image sensor fixedly connected to the optical lens set, and at least one internal optical lens. The at least one internal optical lens and the external optical lens constitute the optical lens set of the camera module. The mounting framework may be a driving motor that drives the optical lens set to move or a holder for securing the optical lens set. The at least one internal optical lens is configured to respond to focus drive of the motor to achieve the camera function of the camera module. Thus, during execution of step 504, the at least one internal optical lens, the mounting framework, the image sensor and the like are sequentially attached to the external optical lens. The center of an orthographic projection of the mounting framework on the transparent cover plate, the center of an orthographic projection of the image sensor on the transparent cover plate, and the center of an orthographic projection of each layer of internal optical lens on the transparent cover plate coincide with the center of the at least one optical lens. Thus, the imaging photosensitivity of the camera module is improved.

Optionally, the camera module may further include a passive element, an FPCB/FPC, a connector, and the like. When the other components are attached to the external optical lens, the passive element, the FPCB/FPC, the connector, and the like also need to be attached.

In step 505, a display panel is provided.

Optionally, when the display panel is an OLED display panel, the display panel may include an anode, a hole injection layer, a hole transport layer (for adjusting the injection speed and the injection quantity of holes), an organic light-emitting layer, an electron transfer layer (for adjusting the injection speed and the injection quantity of electrons), an electron injection layer and a cathode. When the display panel is a LED display panel, the display panel may include a Thin Film Transistor (TFT), a pixel electrode, a liquid crystal layer, a common electrode and a color film layer.

In step 506, the camera module is encapsulated on the display panel.

When being encapsulated, other components in the camera module and the display panel are at the same side of the transparent cover plate in order to guarantee that both the camera module and the display panel are encapsulated in the transparent cover plate.

In summary, according to the manufacturing method of the display device provided in the embodiments of the present disclosure, by processing the transparent cover plate to enable a part of the transparent cover plate to be configured as the target optical lens, and reusing the target optical lens area as the optical lens of the camera module, in comparison with the related art, the thickness of the external optical lens is subtracted from that of the camera module. That is, the thickness of the display device is reduced. Thus, the difficulty in integrating the camera module with the display panel is reduced. High integration of the display device is facilitated.

It should be noted that the step sequence of the manufacturing method of the display device may be appropriately adjusted, and the steps may be increased or reduced accordingly. Any method variation that is easily conceivable for those skilled in the art within the technical scope of the present disclosure should be included in the scope of protection of the present disclosure and therefore will not be repeated.

Those of ordinary skill in the art can understand that all or part of the steps of the above embodiment may be completed by hardware, or through a program instructing the relevant hardware. The program may be stored in a computer readable storage medium which may be a read only memory, a magnetic disk, an optical disk, or the like.

It can be easily understood by those skilled in the art that the technical solution disclosed by the present disclosure can be applied to any product used in a display solution requiring integration of a camera, such as a mobile phone, a tablet PC, a laptop and a recorder.

The above description is merely preferred embodiments of the present disclosure and is not intended to limit the present disclosure. Any modifications, equivalent substitutions, improvements, etc. made within the spirit and principles of the present disclosure should be included in the scope of protection of the present disclosure.

What is claimed is:

1. A camera module, comprising:
a camera and a transparent cover plate attached to the camera, wherein a part of the transparent cover plate is configured as a target optical lens which is used as an external optical lens of the camera, and the transparent cover plate is configured to protect a display device; and
the camera module further comprises:
an optical lens set, which comprises an external optical lens and an internal optical lens, wherein an optical axis of the external optical lens coincides with an optical axis of the internal optical lens; and
a mounting framework and an image sensor that are both fixedly connected to the optical lens set;
wherein a geometric center of an orthographic projection of the mounting framework on the transparent cover plate, a geometric center of an orthographic projection of the image sensor on the transparent cover plate, and a geometric center of an orthographic projection of the internal optical lens on the transparent cover plate coincide with a geometric center of the external optical lens.

2. The module according to claim 1, wherein for the transparent cover plate, a total number of the target optical lens configured by the transparent cover plate is 1.

3. The module according to claim 1, wherein the external optical lens is used as at least one layer of external optical lens in the optical lens set.

4. The module according to claim 1, wherein a total layer number of the optical lenses in the optical lens set is at least 3.

5. The module according to claim 3 wherein the external optical lens is used as an outermost layer of external optical lens in the optical lens set, and a distance between a central point of the external optical lens and any edge of the transparent cover plate is greater than or equal to a distance threshold whose range is from 5 mm to 10 mm.

6. The module according to claim 1, wherein the external optical lens is a concave lens.

7. The module according to claim 1, wherein the mounting framework is a driving motor that drives the optical lens set to move or a holder for securing the optical lens set.

8. The module according to claim 7, wherein the driving motor consists of a MEMS (Micro-Electro-Mechanical System).

9. The module according to claim 7, wherein the driving motor is a voice coil motor.

10. The module according to claim 1, comprising: a front camera module.

11. The module according to claim 1, wherein the transparent cover plate is made of one of glass, quartz and resin.

12. The module according to claim 1, wherein the transparent cover plate is a glass cover plate, a part of the glass cover plate is configured as a target optical lens which is used as an outermost layer of external optical lens of the camera, an optical lens set in the module comprises: the outermost layer of external optical lens and at least two layers of internal optical lenses, wherein an optical axis of the outermost layer of external optical lens coincides with an optical axis of the at least two layers of internal optical lenses;
the external optical lens is a concave lens, and a distance between a central point of the external optical lens and any edge of the glass cover plate is greater than or equal to a distance threshold whose range is from 5 mm to 10 mm;
the module further comprises: a mounting framework and an image sensor that are both fixedly connected to the optical lens set;
wherein a geometric center of an orthographic projection of the mounting framework on the glass cover plate, a geometric center of an orthographic projection of the image sensor on the glass cover plate, and a geometric center of an orthographic projection of each of the internal optical lenses on the glass cover plate coincide with a geometric center of the outermost layer of external optical lens.

13. A display device, comprising a display panel and at least one camera module at a side of the display panel;
wherein the at least one camera module comprises: a camera and a transparent cover plate at a side, away from the display panel, of the camera, the at least one camera module comprises the same transparent cover plate, the transparent cover plate is configured to protect the display panel, at least one target optical lens is disposed in the transparent cover plate, the at least one target optical lens corresponds to the at least one camera module, and the target optical lens is used as an external optical lens of a corresponding camera; and
the camera module further comprises:
an optical lens set, which comprises an external optical lens and an internal optical lens, wherein an optical axis of the external optical lens coincides with an optical axis of the internal optical lens; and
a mounting framework and an image sensor that are both fixedly connected to the optical lens set;
wherein a geometric center of an orthographic projection of the mounting framework on the transparent cover plate, a geometric center of an orthographic projection of the image sensor on the transparent cover plate, and a geometric center of an orthographic projection of the internal optical lens on the transparent cover plate coincide with a geometric center of the external optical lens.

14. The display device according to claim 13, comprising: a camera module, wherein a part of the transparent cover plate is configured as the target optical lens, and the target optical lens is used as an external optical lens of the camera in the at least one camera module.

15. The display device according to claim 13, wherein the display panel is one of an organic light-emitting diode display pan& and a liquid crystal display panel.

16. A manufacturing method of a camera module, comprising:
providing a transparent cover plate configured to protect a display panel in a display device;
processing a part of the transparent cover plate, to enable the processed part of transparent cover plate to be configured as a target optical lens;
providing a camera; and
attaching the transparent cover plate onto the camera, to enable the target optical lens to be used as an external optical lens of the camera; and
wherein the camera module further comprises:
an optical lens set, which comprises an external optical lens and an internal optical lens, wherein an optical axis of the external optical lens coincides with an optical axis of the internal optical lens; and
a mounting framework and an image sensor that are both fixedly connected to the optical lens set;
wherein a geometric center of an orthographic projection of the mounting framework on the transparent cover plate, a geometric center of an orthographic projection of the image sensor on the transparent cover plate, and a geometric center of an orthographic projection of the internal optical lens on the transparent cover plate coincide with a geometric center of the external optical lens.

17. The method according to claim 16, wherein processing a part of the transparent cover plate, to enable the processed part of transparent cover plate to be configured as a target optical lens comprises:
optically processing the transparent cover plate by any one of ELID (Electrolytic In-process Dressing) processing, laser processing, ultrasonic grinding and precision ultrasonic milling, to enable the processed part of transparent cover plate to be configured as the target optical lens.

18. A manufacturing method of a display device, comprising:
manufacturing a camera module with the manufacturing method of the camera module of claim 16;
providing a display panel; and
encapsulating the camera module on the display panel.

\* \* \* \* \*